United States Patent [19]

Pearson et al.

[11] 4,251,846
[45] Feb. 17, 1981

[54] APPARATUS FOR SENSING SHORT CIRCUIT FAULTS IN ALTERNATING CURRENT SUPPLY LINES

[75] Inventors: Frank K. Pearson, Buxton; Harold Lord, Monyash, near Bakewell, both of England

[73] Assignee: National Research Development Corporation, London, England

[21] Appl. No.: 37,080

[22] Filed: May 8, 1979

[30] Foreign Application Priority Data

May 12, 1978 [GB] United Kingdom ............... 19304/78

[51] Int. Cl.$^3$ ............................................. H02H 3/26
[52] U.S. Cl. .................................... 361/30; 361/80
[58] Field of Search ....................... 361/30, 42, 79, 80, 361/86, 87

[56] References Cited

U.S. PATENT DOCUMENTS

| | | | |
|---|---|---|---|
| 3,543,092 | 11/1970 | Hoel | 361/80 |
| 4,179,651 | 12/1979 | Vitins | 361/79 X |

FOREIGN PATENT DOCUMENTS 52-48033  4/1977  Japan .......................... 361/80

OTHER PUBLICATIONS

"Phase Sensitive Short Circuit Protection"–Gray *Mining Technology* Apr. 1978, pp. 133–136.

*Primary Examiner*—Harry E. Moose, Jr.
*Attorney, Agent, or Firm*—Blanchard, Flynn, Thiel, Boutell & Tanis

[57] ABSTRACT

Apparatus is provided for sensing and responding to short circuit faults, in particular in three phase alternating current supply lines for direct-on-line starting three phase squirrel cage induction motors. Line current in each line is sensed by a respective current transformer and signals representing both the amplitude and phase of each line current are produced. Line-to-line or line-to-neutral voltage for each phase is also sensed, by photo-electric isolator circuitry, and signals produced representative of the respective phases of these voltages. Logic circuitry is used to produce from the signals representative of current and voltage phases three phase difference signals in the form of currents each varying substantially directly with the difference between the respective current and voltage phases of the respective line. The relationships between these difference signals and the respective current amplitude signals are compared with the relationship which corresponds to conditions from starting to normal running of the motor, and an output signal is produced representing whether there is correspondence or not between the compared relationships. If lack of correspondence is indicated, a circuit breaker is operated to break the supply lines upstream of the sensing equipment.

16 Claims, 15 Drawing Figures

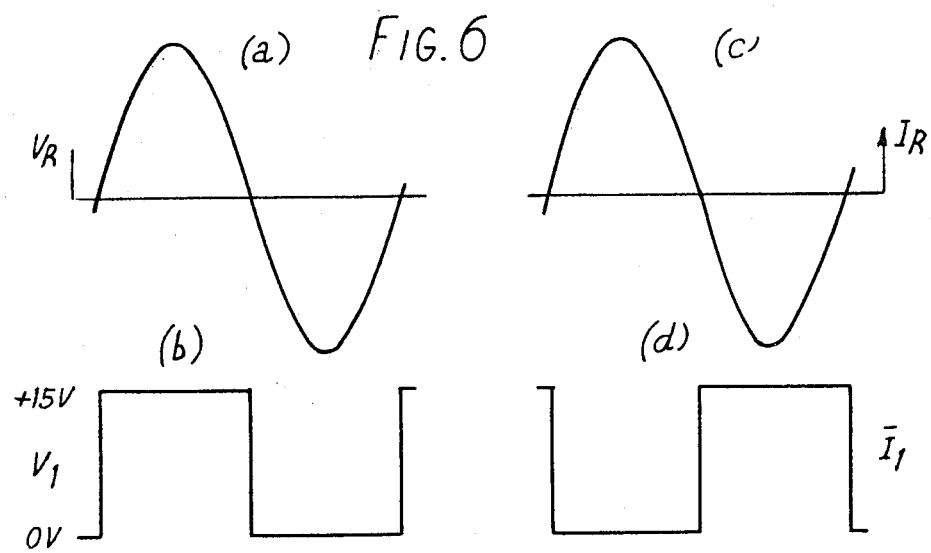
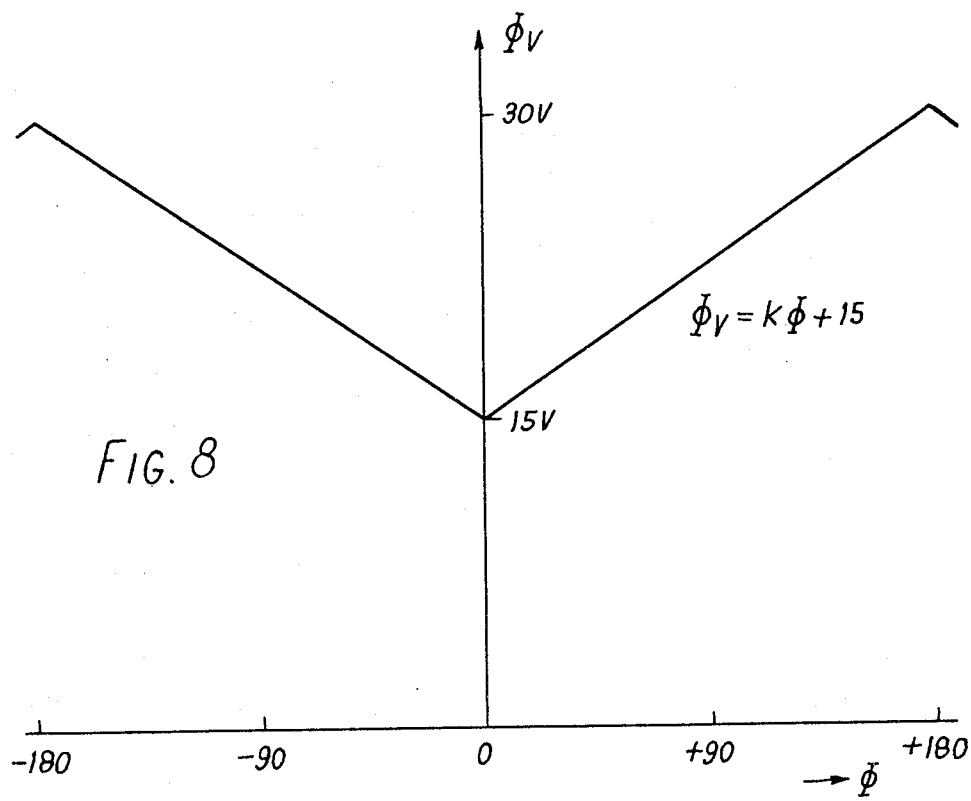

FIG. 14
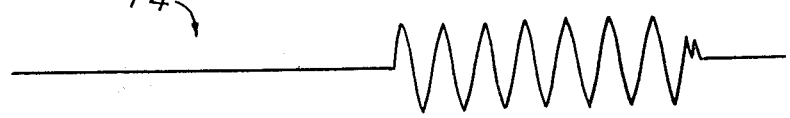

FIG. 15
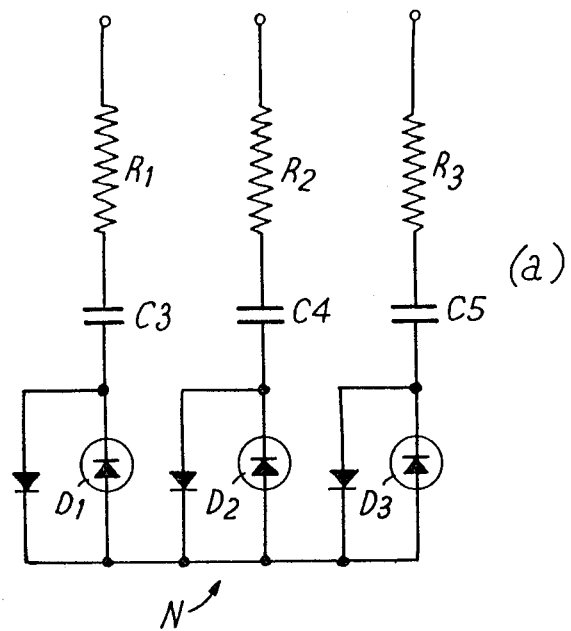
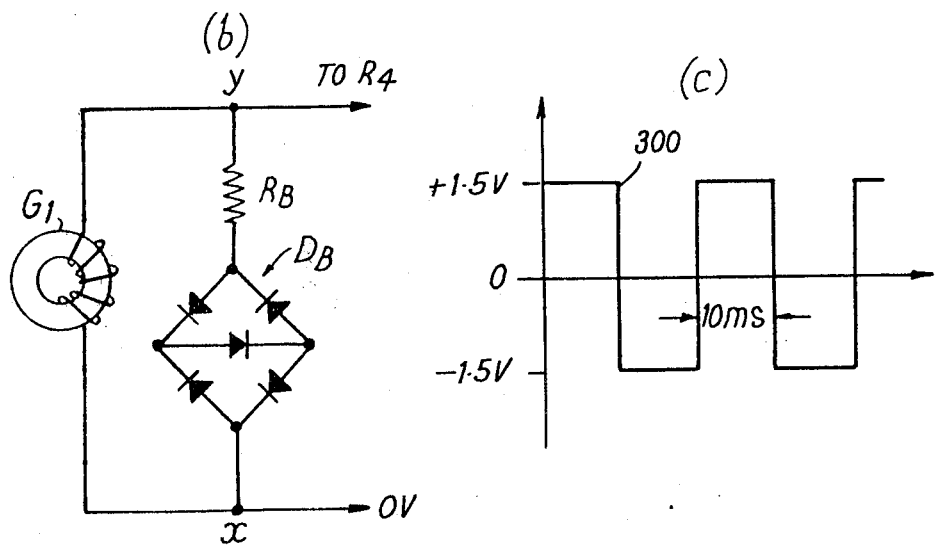

APPARATUS FOR SENSING SHORT CIRCUIT FAULTS IN ALTERNATING CURRENT SUPPLY LINES

BACKGROUND OF THE INVENTION

This invention relates to apparatus for sensing short circuit faults in alternating current supply lines and, especially although not exclusively, to the protection of alternating current supplies when arranged for supplying direct-on-line starting three phase squirrel cage induction motors.

The present invention has arisen from the consideration of a particular problem which is met in the use of direct-on-line starting three phase squirrel cage induction motors in coal mines but is of more general application.

The particular problem mentioned above is that of providing adequate protection of a three phase supply against short circuits between the phase lines or to a neutral point while permitting direct-on-line starting of three phase squirrel cage induction motors connected to the three phase supply. That this is a problem is due to the fact that the value of the starting current drawn in each line by such a motor during direct-on-line starting has several times, for example four to ten times, the amplitude of the current drawn when the motor is running under full load conditions and consequently no protection based merely upon sensing of the amplitude of the currents drawn is practicable for short circuit faults which are drawing currents which are of less amplitude than that of the motor starting current. While a conventional motor overload protection will respond to short circuit current in this range, its inherent time delay will be long enough to permit damage to be done to the supply and possibly also the motor.

Direct-on-line starting is used for three phase squirrel cage induction motors in coal mines and other hazardous environments because simplicity in operating equipment is found to be essential there. However, the risk that supply lines may be damaged or cut is always present and it is also essential that the consequent risk of fire or explosion started by electrical fault arcing should be minimised and eliminated if at all possible. Hence there is a requirement for means which will isolate the source of three phase supply from any short circuit faults on the supply lines.

SUMMARY OF THE INVENTION

According to the present invention there is provided apparatus for sensing short circuit faults in alternating current supply lines, the apparatus including means for sensing line current in an alternating current supply line and producing signals representative of the sensed amplitude and phase of line current flowing in operation, and means for sensing the line to line or line to neutral voltage of the supply line and producing a signal representative of the phase of the line to line or line to neutral voltage. Phase difference means are coupled to receive the signals which are representative of the phases of the said current and voltage and arranged to produce in response thereto a signal having a measure which varies substantially directly with difference between the said phases. A relationship of the signal representative of sensed current amplitude and the said signal produced by the difference means is then compared with a predetermined relationship of amplitude and phase difference and an output signal is produced by the comparison means, this output signal being representative of whether or not the sensed current amplitude is larger than the corresponding amplitude as determined by the said predetermined relationship for the said difference between the said phases. The apparatus may include means for interrupting at least the said supply line in response to the said output signal being representative of the sensed current amplitude being larger than the said corresponding amplitude, the interrupting means being coupled to the comparing means to receive the said output signal.

To protect a three phase supply an embodiment of the present invention has means for sensing each line current in three phase lines and producing signals representative of the sensed amplitudes and phases of the line currents flowing in operation, means for sensing the line to line or line to neutral voltages of the supply lines and producing signals representative of the phases of the line to line or line to neutral voltages, difference means coupled to receive the signals which are representative of the said phases and arranged to produce in response thereto three signals each of which has a measure which varies substantially directly with difference in phase between the respective line current and line to line or line to neutral voltage of a respective one of the three phase lines, and means for comparing for each phase line a relationship of the respective one of the signals representative of sensed current amplitude and the respective one of the signals produced by the difference means with a predetermined relationship of amplitude and phase difference and producing in response thereto an output signal representative of whether or not any one or more of the sensed current amplitudes is larger than the corresponding amplitude as determined by the respective predetermined relationship for the respective one of the said differences in phase between the respective line current and line to line or line to neutral voltage. Means are provided for interrupting the three supply lines in response to the said output signal being representative of any one or more of the sensed current amplitudes being larger than the said corresponding amplitude, the interrupting means being coupled to the comparing means to receive the said output signal.

In one such three phase embodiment which is intended to be used to protect a three phase supply to a direct-on-line starting three phase squirrel cage induction motor, the predetermined relationship is, for each phase line, of the form $$I_L = \frac{n}{R_B} \cdot mK(\Phi - \Phi_c)$$

where $I_L$ is the amplitude of the respective line current in amperes, m is a dimensionless constant, K is a further constant having units of voltage per degree, $R_B$ is a burden resistance in ohms, n is the dimensionless ratio of a current transformer ie. the ratio of secondary to primary turns, $\Phi$ is the phase difference between the respective line to neutral voltage and line current measured in degrees, and $\Phi_c$ is a phase constant measured in degrees.

Preferably the signals representative of phase are square waves. The difference in phase can then be obtained by using logic circuitry in the said difference means.

In one preferred embodiment in which the signals representative of phase are square waves and the difference in phase is obtained by using logic circuitry in the difference means, logic signals which are voltage signals are produced of which the average algebraic sum over one cycle varies directly with the phase difference. However, the difference means further includes in this embodiment a plurality of summing resistors connected at a common junction thereof to one input terminal of an operational amplifier included in the comparing means, and consequently the signal produced by the difference means and supplied to the comparing means is a current signal the average magnitude of which over one cycle varies substantially directly with the difference in phase. The operational amplifier is preferably a differential amplifier arranged to receive the said current signal at its inverting input and a reference signal at its non-inverting input, the reference signal being in accordance with the said predetermined relationship.

It is also preferable that in an embodiment having interrupting means there be provided a high current override which actuates the interrupting means more rapidly than the comparing means would do so when line current greater than the starting current amplitude is sensed.

When installed, apparatus which includes the interrupting means has the said interrupting means arranged to act on the supply line or lines at a position between the source of the supply and the said sensing means, i.e. upstream of the sensing means.

The invention will now be described in more detail, solely by way of example, with reference to the accompanying drawings.

BRIEF DESCRIPTION OF THE DRAWINGS

FIG. 6 is a graphical representation of wave forms appearing during the operation of the embodiment of FIG. 5, FIG. 8 is a graphical representation of a voltage as a function of a phase difference for explaining the operation of a part of the embodiment of FIG. 5, FIG. 14 is a graphical representation of signals obtained from the test circuit of FIG. 9 during the occurence of a two phase short circuit fault when the motor is not connected, and FIGS. 15 (a), (b) and (c) are two circuit diagrams and a graphical representation respectively of modifications of parts of the embodiment of FIG. 5 and a voltage appearing therein.

DETAILED DESCRIPTION OF THE PREFERRED EMBODIMENTS

In the description which follows, all references to three phase induction motors are references to three phase squirrel cage induction motors.

Figure 1:
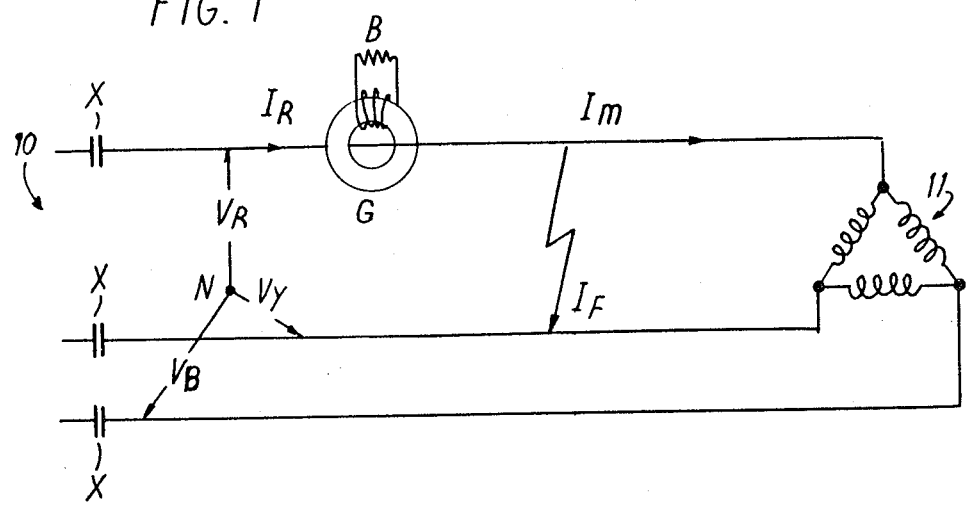
FIG. 1 is a circuit diagram of supply connections to a three phase stator of an induction motor.

FIG. 1 shows schematically connections between a three phase electrical supply 10 and the stator windings 11 of a three phase induction motor connected for direct-on-line starting. The three phase connections include respective sets of circuit breaker contacts X which are closed when the motor is running.

In normal operation, three equal phase voltages of amplitudes $V_R$, $V_Y$ and $V_B$ are established between the three phase lines, known as the red, yellow and blue phases, and a neutral point. This is illustrated in FIG. 1 where $V_R$, $V_Y$ and $V_B$ are represented as existing between the three phases lines and a point N representing the neutral point.

Corresponding to the three phase voltages there are three line currents of amplitudes $I_R$, $I_Y$ and $I_B$ which flow in the respective phase lines. These three currents are, under normal conditions, of equal amplitude. However, if a fault appears in which the insulation between two of the phase lines is more or less ineffective, a fault current, e.g. $I_F$, as illustrated in FIG. 1, flows between these two phase lines, and the respective line currents of the two lines increase to supply the fault current in addition to the stator currents. The presence of the fault alters the impedance between the two lines involved in the fault so that the phase angle between the respective line current and the respective phase voltage of each of these two lines is reduced from that prevailing under normal conditions i.e. in the absence of the fault. Thus the presence of a fault increases the amplitudes of the line currents involved and reduces the phase angle between these line currents and the respective phase voltages.

The phase angle relationship between a line current and the corresponding phase voltage can be obtained by first producing two signals, one representative of the line current and the other representative of the corresponding phase voltage, and supplying the two signals thus produced to a phase discriminator. Means for producing a voltage signal representative of the red line current is shown in FIG. 1 and comprises a current transformer G arranged to sense the red line current and a burden resistor B connected across the secondary winding of the transformer G. The voltage signal appears across the resistor B and is in phase with and proportional to the red line current. Another voltage signal which is in phase with the corresponding red phase voltage can be provided by a suitable voltage transformer (not shown) or, at less expense, an electro-optical isolator arrangement.

Figure 4:
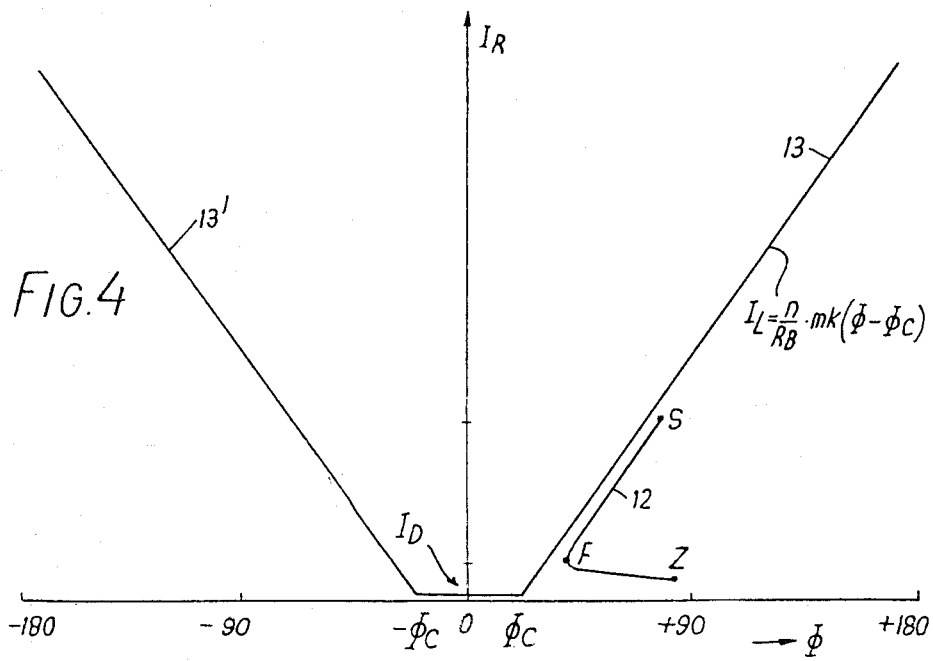
FIG. 4 is a graphical representation of a line current characteristic of an induction motor.

In FIG. 4, which is a graph of the amplitude $I_R$ of the red line current against phase difference between the red line current and the red phase voltage, with the current lagging the voltage taken as a positive phase difference and, vice versa, the red line current amplitude characteristic of a three phase induction motor is represented by a curve 12 on which three points are marked, namely, S, F and Z. The point S corresponds to the conditions of red line current amplitude and red phase difference at stall or starting of the motor. As the rotor (not shown) of the motor accelerates, the operating conditions move down the curve 12 from the point S to a point F corresponding to operation under full mechanical loading, the motor then working at maximum efficiency. If the motor is in fact not fully loaded, the operating conditions do not rest at the point F but move along the curve 12 from the point F towards the point Z which corresponds to operation under zero mechanical loading. The actual point on the curve 12 at which the motor operates depends upon the mechanical loading and will lie at F or Z or between these two points provided the motor is not overloaded. If the mechanical loading is constant, as in the case of a fan, the point remains stationary. If the mechanical loading varies between limits, as in the case of a coal cutter, the point will oscillate on the curve 12.

The portion of the curve from the point S to the point F is found to be substantially straight and inclined at an acute angle to the positive value part of the phase difference axis.

Both the blue line current amplitude and the yellow line current amplitude behave in the same way, having operating curves corresponding to the curve 12 in which the corresponding starting and full mechanical loading points define a straight line have the same slope and extent as the portion SF of the curve 12.

The current amplitude at S, the starting current, is, in this example, six times the amplitude of the current at F, the current amplitude at full mechanical loading.

As shown in FIG. 4, a line 13 can be drawn which is parallel to and closely spaced above the portion SF of the curve 12 and is defined by the equation $$I_L = \frac{n}{R_B} \cdot mK (\Phi - \Phi_c)$$

where $\Phi$ is the phase difference, $I_L$ is the line current amplitude, $(n/R_B) \cdot mK$ is the slope, $\Phi_c$ is a constant which is the intercept on the phase difference axis, and n, $R_B$, m and K are constants which are explained hereinafter.

Any condition which results in the phase current amplitude and the phase difference defining a point between the amplitude axis and the line 13 is a fault condition and can, in accordance with the present invention, be detected by comparing the line current amplitude and phase difference values at the point in question with those defined by the line 13. In practice, such comparison is carried out for each phase line.

Figure 2:
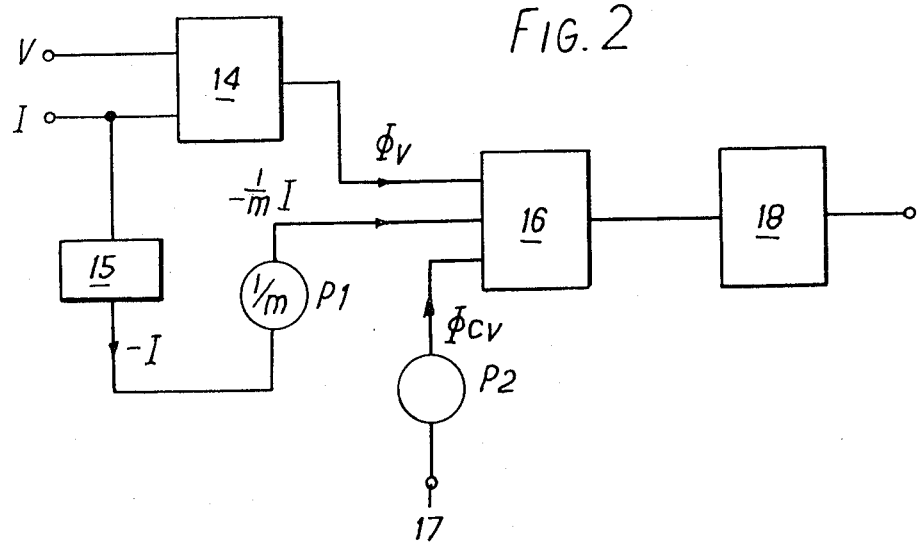
FIG. 2 is a block diagram of part of an embodiment of the invention.

FIG. 2 shows apparatus for comparing line current amplitude and phase difference values, for one phase, with a defined linear line current and phase difference relationship. A voltage signal of amplitude V, provided by means not shown, is in phase with but not necessarily proportional to the line to neutral voltage of one phase of a supply to an induction motor (not shown). Another voltage signal of amplitude I, provided by means not shown, is in phase with and proportion to the corresponding line current of the said one phase. The signals of amplitude V and I are supplied to a phase discriminator 14 which in response thereto produces a voltage signal $\Phi_v$ which is proportional to the phase difference between the signals of amplitude V and I. In other words $\Phi_v = K\Phi$ where $\Phi$ is the phase difference and K is a factor of proportionality having units of volts per degree.

The signal of amplitude I is also supplied to an inverter 15 which produces the signal $-I$ which is proportional to I and of opposition polarity to the signal $\Phi_v$. The signal $-I$ is supplied to a voltage dividing potentiometer P1 which divides the signal $-I$ by a factor m to produce a voltage signal $-(1/m) \cdot I$.

A comparator 16 is supplied with a reference voltage $\Phi_{cv}$ set by a potentiometer P2 which receives a constant voltage at a terminal 17. The comparator 16 tests the signals $\Phi_v$ and $-(1/m) \cdot I$ with the equation $$I = m(\Phi_v - \Phi_{cv})$$

by comparing the difference $[\Phi_v - (1/m) \cdot I]$ with the reference voltage $\Phi_{cv}$.

If $[\Phi_v - (1/m) \cdot I] \geq \Phi_{cv}$, the comparator 16 produces zero output voltage.

If $[\Phi_v - (1/m) \cdot I] < \Phi_{cv}$, the comparator 16 produces an output voltage sufficient to energise a relay unit 18. This output voltage is referred to hereinafter as the fault indicating output voltage. Since $\Phi_v = K\Phi$ where K is a constant and $\Phi$ is the phase difference the equation $I = m(\Phi_v - \Phi_{cv})$ may be written $$I = mK(\Phi - \Phi_c)$$

where $\Phi_c$ is a constant phase difference. Furthermore, since we may relate I to the line current amplitude $I_L$ by the equation $$I = RI_L$$

where R is a constant having the dimensions of resistance, the equation for the line 13 can be written $$I_L = (1/R)mK(\Phi - \Phi_c)$$

In one example of means for sensing line current and producing a signal representative of the line current amplitude which is described hereinafter with reference to FIG. 5, $$R = R_B/n$$

where $R_B$ is a burden resistor impedance and n a current transformer ratio, so that the equation for the line current amplitude may be written $$I_L = (n/R_B) \cdot mK(\Phi - \Phi_c)$$

The energisation of the relay unit 18 is used to open a circuit breaker having contacts in the supply lines to the motor (not shown). Since it is necessary to break the connections in all three phases of a three phase supply to a three phase induction motor whenever a fault occurs, the relay unit 18 controls a circuit breaker with three contact sets such as the contact sets X of FIG. 1 and is arranged to be energised by the fault indicating output voltage of any one of the three comparators, one of which is the comparator 16 of FIG. 2 and the other two of which are respective comparators of two sets of apparatus as described with reference to FIG. 2 up to and including the comparator 16 and arranged respectively to receive voltage signals in phase with and proportional to the yellow and blue line currents, and in phase with the yellow and blue phase voltages. The potentiometer $P_2$ can be common to all three comparators.

One example of a suitable circuit for the phase discriminator 14 is a phase angle to pulse width converter such as that described at page 544 of Electronic Measurements for Scientists by Howard V. Mahnstadt, Christie G Enke and Gary Horlick, and published in 1974 by W. A. Benjamin, Inc., of Merlo Park, Calif. and Reading, Mass., United States of America, U.S. Library of Congress Catalog Card No. 73-17960, provided at the output thereof with an integrating circuit to convert pulse width to voltage.

The inverter 15 may simply be a diode connected to block those half cycles of the signal of amplitude I which have the same polarity as the voltage $\Phi_y$.

The comparator 16 may comprise a two input differential operational amplifier having two summing resistors connecting its inverting input to the discriminator 14 and the potentiometer $P_1$ respectively, and a level detector at its output to provide an all or nothing output voltage response.

Figure 3:
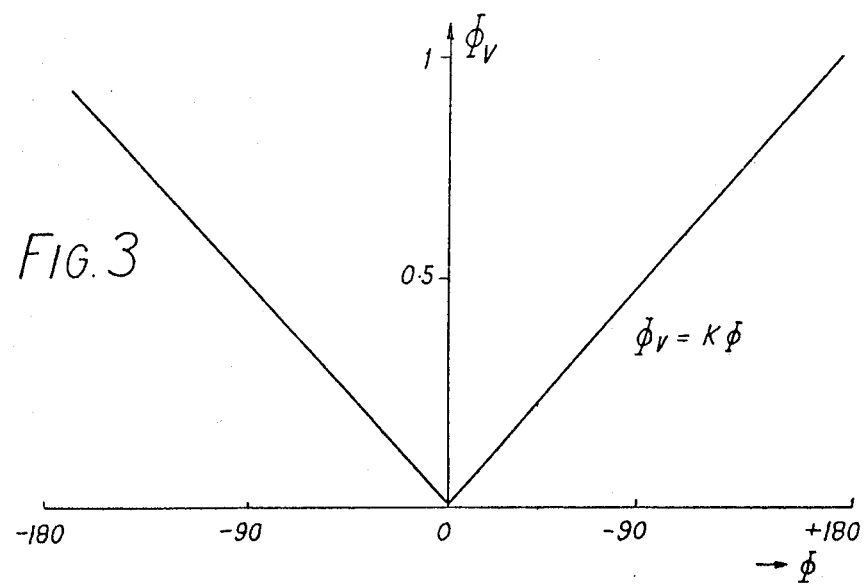
FIG. 3 is a graphical representation of a voltage which is a function of phase difference.

The direct proportionality of the voltage signal $\Phi_y$ to the phase difference between the signals of amplitude V and I is illustrated graphically in FIG. 3 which also shows that $\Phi_y$ is symmetrical about the $\Phi_v$ axis, i.e. the voltage signal $\Phi_y$ does not distinguish between leading and lagging phase differences. Consequently the comparator 16 in effect tests the two equations $$I = m(\Phi_v - \Phi_{cv})$$

and $$I = -m(\Phi_v + \Phi_{cv})$$

the latter of the two equations being that of the voltage analog of the equation represented in FIG. 4 by a line 13'. Consequently the relay unit 18 is energised if the operating condition lies between the lines defined by these two equations. The two lines do not quite reach the phase difference axis since the phase discriminator 14 requires a certain minimum of input voltage to cause it to operate, the minimum input voltage corresponding to value $I_D$ of the amplitude of the line current.

The left hand quadrants of FIGS. 3 and 4 are not used in some applications of the embodiment and are described since they occur in the particular example of apparatus which is described with reference to FIG. 2.

In producing a signal which is a measure of the phase difference between a line to neutral voltage and a line current it is convenient to operate with square waves since zero transitions between which the phase difference is to be sensed are then readily detected. Treating the respective conditions of two such square waves, one in phase with the line to neutral voltage and the other in phase with the line current, as binary conditions with the high level representing 1 and the low level representing 0, it is seen that the binary logic condition 1.1 represents an overlap of positive half cycles of phase voltage and phase current, 0.0 represents an overlap of negative half cycles and 1.0 and 0.1 represent overlaps of positive and negative half cycels, and negative and positive half cycles. Each of the four binary logic conditions represents in its duration the extent, and hence phase angle, of the overlap which may be anything from vanishingly small to a complete half cycle. Furthermore, it can be seen that of the four logic conditions, two, namely 1.0 and 0.1, have durations which correspond directly to the phase difference between the phase voltage and the line current. The selection of 1.0 and 0.1 from the four possible logic conditions corresponds to an exclusive −OR operation on two logic signals and can therefore be implemented in the form of a two input exclusive −OR gate having two square waves respectively in phase with the phase current and the phase voltage supplied as the logic input signals thereto. However, it is found preferable to make use of an arrangement of four identical NAND gates instead of an exclusive −OR gate. A preferred embodiment in which four NAND gates constitute a means for producing signals which can be combined so as to be representative of a phase difference is shown in FIG. 5.

Figure 5:
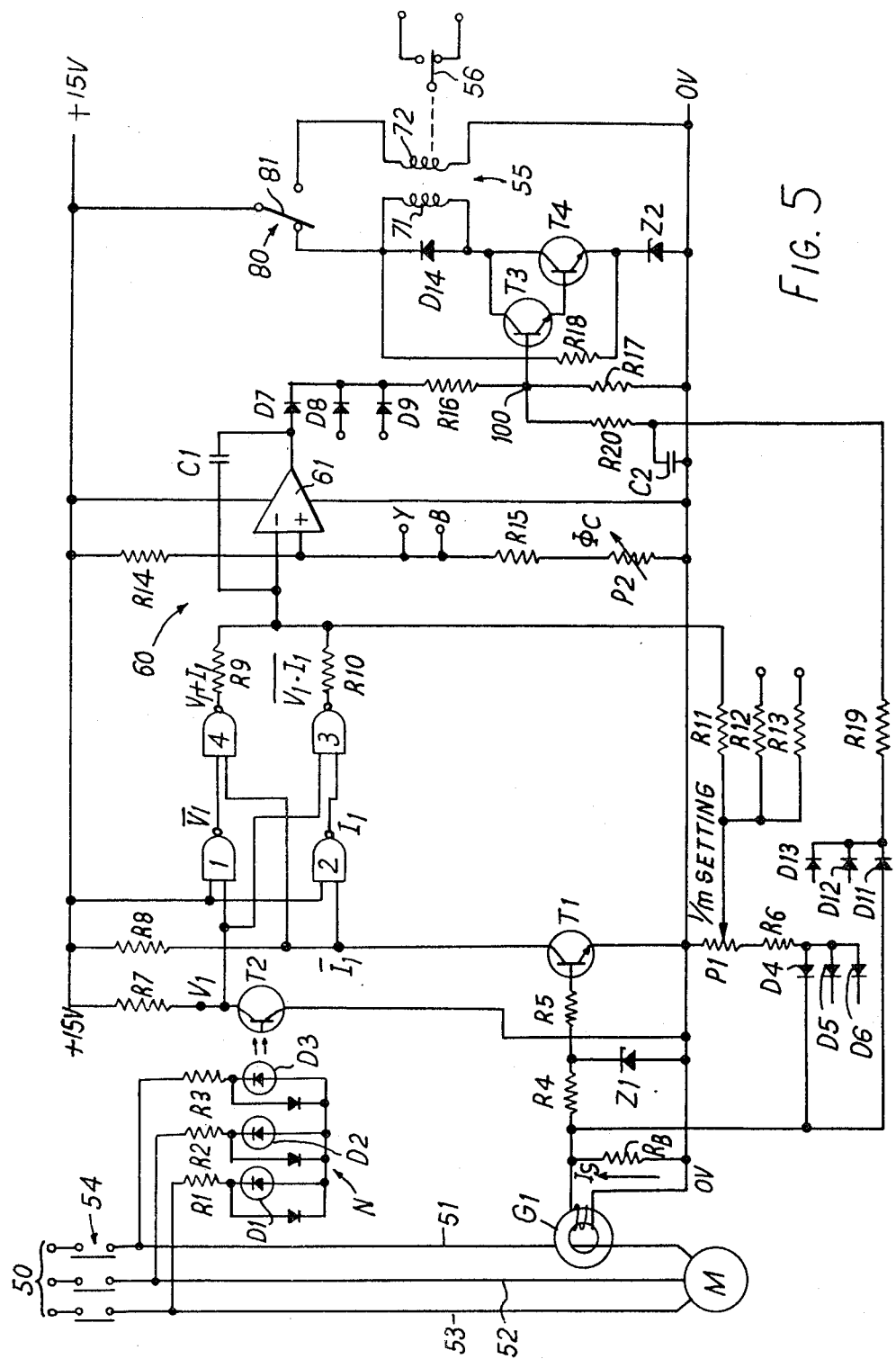
FIG. 5 is a circuit diagram of another embodiment of the invention.

In FIG. 5 a three phase induction motor M is shown connected to a three phase supply 50. The red phase, yellow phase and blue phase lines 51, 52 and 53 include circuit breaker contact sets 54, one set in each line, which are controlled by a magnetically latched relay 55 which has a single change-over contact 56 connected in the supply circuit (not shown) of the coil (not shown) of the circuit breaker to which the three sets 54 belong.

When the motor M is being supplied normally by the supply 50, the relay contact 56 is held in such a position that the sets 54 of circuit breaker contacts are closed.

Between a neutral point N and each of the lines 51 to 53 a series combination of a resistor, R1 or R2 or R3, and a IRE-diode (infra-red emitting diode), D1 or D2 or D3, is connected. Each of the IRE-diodes has an oppositely poled diode in parallel therewith. Whenever the red phase voltage is negative with respect to the neutral point N, the IRE-diode D3 conducts. Similarly the IRE-diodes D2 and D3 conduct whenever the yellow and blue phase voltages respectively are negative with respect to the point N. Each of the IRE-diodes D1, D2 and D3 is arranged to irradiate a respective photo-transistor only one of which is shown, namely the photo-transistor T2 which is irradiated by the red phase IRE-diode D3. Each IRE-diode and photo-transistor constitutes an electro-optical isolator.

The collector of the photo-transistor T2 is connected through a resistor R7 to a positive supply line at +15 volts. The emitter of the photo-transistor T2 is connected directly to a zero volts supply line. Consequently, throughout each positive half-cycle of red phase voltage the collector of the photo-transistor T2 is at +15 volts and throughout each negative half-cycle of red phase voltage the collector is at 0 volts. One cycle of the resultant square wave, designated $V_1$, at the collector of the transistor T2 is shown at (b) in FIG. 6 in relation to one cycle of the red phase voltage at (a) in FIG. 6. Thus the sinusoidal red phase voltage is represented by a binary signal, the square wave $V_1$, switching between 0 volts and +15 volts in phase with the red phase voltage.

Two further square waves, each in phase with a respective one of the yellow and blue phase voltages are produced similarly.

Each of the three supply lines 51 to 53 forms the primary of a respective current transformer, the red line current transformer $G_1$ only being shown in FIG. 5. One end of the secondary of the transformer $G_1$ is connected to the zero volts supply line and through a burden resistor $R_B$ to its other end. A current $I_s$ which is in phase with and proportional to the red line current flows through the burden resistor $R_B$ when the motor M is connected to the supply 50. The said one end of the secondary, which will now be referred to as the active end, is coupled through two series resistors R4 and R5 to the base of an NPN transistor T1 whose emitter is connected directly to the zero volts supply line and whose collector is connected through a resistor R8 to the +15 volts supply line. A zener diode Z1 is connected between the base and emitter of the transistor T1 to protect the base-emitter junction from excessive forward bias A series combination of a diode D4, a resistor R6 and a potentiometer P1 is connected in parallel with the burden resistor $R_B$. The resistor R6 and the potentiometer P1 also form respective parts of two other such series combinations, completed by diodes D5 and D6 respectively, which are connected in parallel with respective burden resistors (not shown) of the yellow and blue line current transformers (not shown).

It would be possible to have separate diodes D4, resistors R6 and potentiometers P1 for each of the three phases. However, apart from using extra components, such an arrangement has a further disadvantage in that it tends to produce spurious indication of a short circuit fault in the motor starting period during which a considerable transient current asymmetry appears in the three supply lines. By using a common potentiometer P1 for all three phases as shown in FIG. 5 the effects of current asymmetry are averaged out over the 20 millisecond period of the supply frequency.

A high current override coupling comprising a diode D11 in series with a resistor R19 and a capacitor C2 in parallel with two resistors R20 and R17 couples the active end of the secondary of the transformer $G_1$ to the zero volts supply line.

Two further high current override couplings are provided by coupling the respective active ends of the respective secondaries of the two current transformers not shown through diodes D12 and D13 to the junction of the diode D11 with the resistor R19.

In operation positive cycles of the secondary current of the transformer $G_1$ flow through the burden resistor $R_B$ and the high current override coupling D11, R19 and R20, and negative cycles thereof flow through the burden resistor $R_B$ and the series combination D4, R6 and P1.

The transistor T1 conducts only throughout the positive half-cycles of the secondary current and operates so as to be saturated throughout these half-cycles. A square wave $\overline{I_1}$ which is of opposite phase to the red line current $I_R$ and switching between 0 volts and +15 volts is thus produced at the collector of the transistor T1. A single cycle of the square wave $\overline{I_1}$ is shown at (d) in FIG. 6 in relation to the corresponding cycle of the red phase current which is shown at (c) in FIG. 6.

The signal $V_1$ is supplied to one input of a two input NAND gate 1 which is one of four such NAND gates 1, 2, 3 and 4. The other input of the gate 1 is connected directly to the +15 volt line so that the gate 1 acts as a logic inverter and produces a singal $\overline{V_1}$ at its output.

The signal $\overline{I_1}$ is supplied to one input of the NAND gate 2 which has its other input connected directly to the +15 volt supply line and therefore acts as a logic inverter producing a signal $I_1$ at its output. The output of the NAND gate 2 is connected to one input of the NAND gate 3 which has its other input connected to the collector of the transistor T2 and therefore receives the signal $V_1$. Thus the NAND gate 3 receives the signals $V_1$ and $I_1$ and therefore produces at its output a signal $\overline{V_1 \cdot I_1}$.

The output of the NAND gate 1 is connected to one input of the NAND gate 4 which has its other input connected to the collector of the transistor T1 and therefore receiving the signal $\overline{I_1}$. Thus the inputs to the gate 4 are $\overline{V_1}$ and $\overline{I_1}$, so that its output produces a signal $\overline{\overline{V_1} \cdot \overline{I_1}}$, i.e. $V_1 + I_1$.

The conditions $\overline{V_1 \cdot I_1}$, and $\overline{V_1 \cdot I_1}$ correspond to the input conditions for a two input AND gate to complete an exclusive −OR operation on $V_1$ and $I_1$. However, it is not necessary to connect the outputs of the NAND gates 3 and 4 to an AND gate since the algebraic sum, as opposed to the logic product, of $\overline{V_1 \cdot I_1}$ and $(V_1 + I_1)$ gives a signal the average value of which in analog terms is a measure of the phase difference between $V_1$ and $I_1$, as is shown in FIG. 7.

Figure 7:
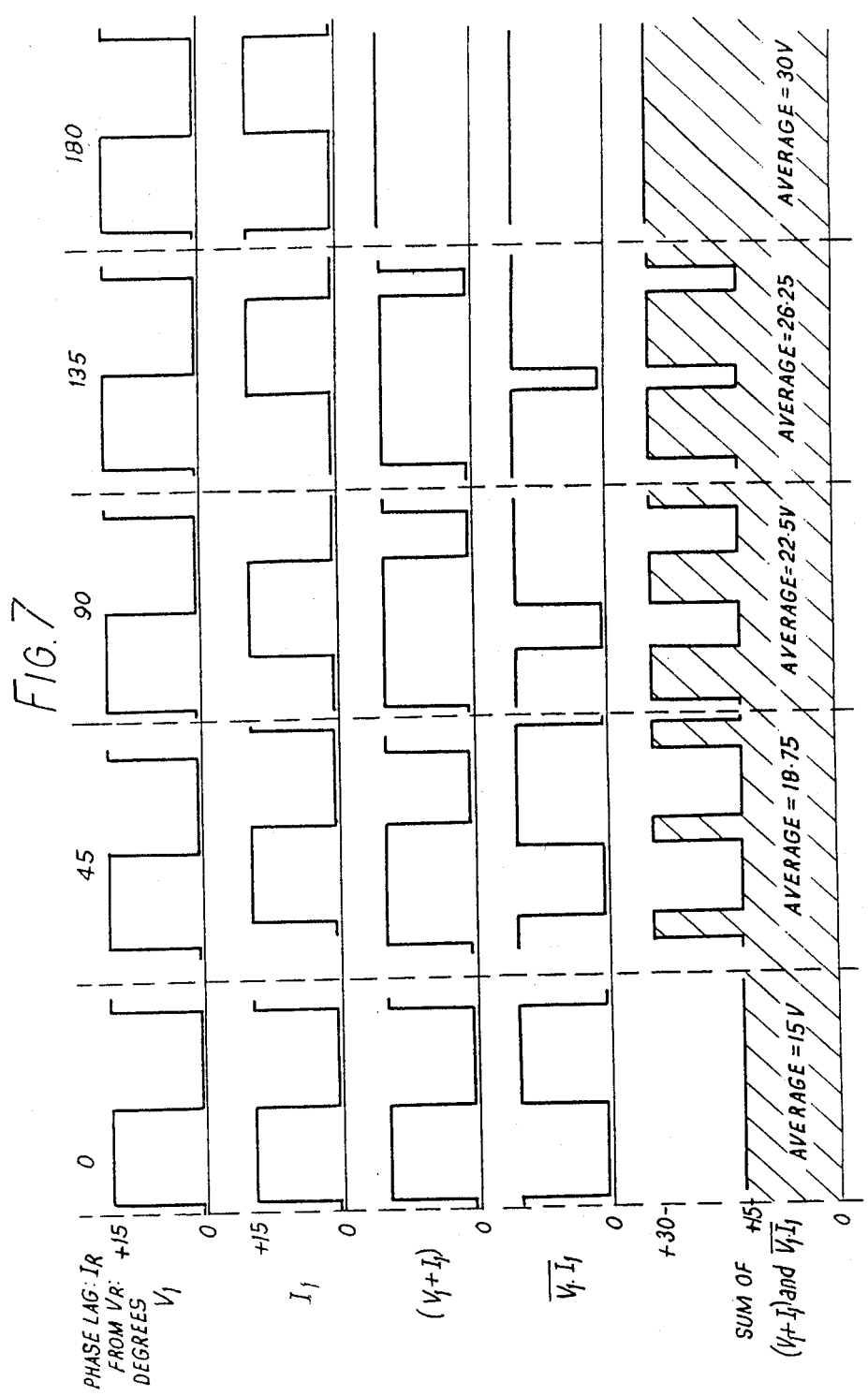
FIG. 7 is a graphical representation of further waveforms which may appear in or be useful in explaining the operation of the embodiment of FIG. 5.

In FIG. 7 there are shown, in columns reading from the left, five possible phase differences between $V_1$ and $I_1$, namely, 0°, 45°, 90°, 135°, and 180°. Reading from the top to the bottom of each column, single cycles of each of the signals, $V_1$, $I_1$, $(V_1 + I_1)$, $\overline{V_1 \cdot I_1}$ and the algebraic sum of $(V_1 + I_1)$ and $\overline{V_1 \cdot I_1}$ are shown. It will be seen from the average values given of the algebraic sum signal that for each increase of 45° in the phase difference between $V_1$ and $I_1$, the average value of the algebraic sum increases by 3.75 volts. FIG. 8 shows the linear relationship between these variables, in which K, the constant of proportionality introduced previously has the value 0.833 volts per degree.

The signals $\overline{V_1 \cdot I_1}$ and $(V_1 + I_1)$ are not averaged as voltage signals in the embodiment of FIG. 5 but are algebraically summed as current signals in a summing arrangement which is connected to a comparator 60.

The comparator 60 is also connected to a resistor R9 having one end connected to the output of the NAND gate 4, a resistor R10 having one end connected to the output of the NAND gate 3, and a resistor R11 having one end connected to the sliding contact of the potentiometer P1. The other ends of the resistors R9, R10 and R11 are connected to the inverting input of an operational differential amplifier 61. The resistances of the resistors R9, R10 and R11 are equal.

The output of the amplifier 61 is coupled back to its inverting input by a capacitor C1. Consequently the voltages appearing at the outputs of the NAND gates 3 and 4 and the sliding contact of the potentiometer P1 are summed and integrated.

The non-inverting input of the amplifier 61 is connected to a reference voltage source comprising two fixed resistors R14 and R15 and a variable resistor P2 connected in series with one another, the non-inverting input of the amplifier 61 being connected to the junction between the resistors R14 and R15, one end of the resistor R14 being connected to the +15 volts supply line, and one end of the resistor P2 being connected to the zero volts supply line.

In operation, the output of the amplifier 61 stays at substantially zero volts when the average aglebraic sum over one cycle of the voltages at the said one ends of the resistors R9, R10 and R11 is greater than the voltage at the non-inverting input of the amplifier 61, whereas the output of the amplifier rises to +15 volts with a time constant determined by the values of C1, R9, R10 and R11 when the said sum is less than the voltage at the non-inverting input. The time then taken by the comparator 60 to change from an output signal of substantially zero volts to an output signal of +15 volts depends on the time constant and the magnitude of the difference between the sum one ends of resistors R9, R10 and R11, and the voltage at the non-inverting input.

The output of the amplifier 61 is connected to the anode of an isolating diode D7 the cathode of which is connected to one end of a resistor R16 which is in series with the resistor R17.

A junction point 100 at the ends of the resistors R16, R17 and R20 is connected to the base of a first NPN transistor T3 of a Darlington pair T3 and T4.

The capacitor C2 connected in parallel with the series combination of the resistors R17 and R20 protects the Darlington pair against high current surges which may occur in response to high amplitude line current sensed by the current transformer $G_1$ or either of the two other current transformers not shown.

The emitter of the second NPN transistor T4 of the Darlington pair is connected to the cathode of a Zener diode Z2 the anode of which is connected to the zero volts supply line. The collectors of the two NPN transistors T3 and T4 are connected through the operating coil 71 of the magnetically latched relay 55 and a manually operable single pole two-way set-reset switch 80 to the +15 volts supply line. In FIG. 5 the movable contact 81 of the switch 80 is shown in its set position. When the contact 81 is in its reset position, the coil 71 and the Darlington pair are disconnected from the +15 volts supply line, and the reset coil 72 of the relay 55 is connected directly between the +15 volts and zero volts supply lines.

A resistor R18 is connected in parallel with the series combination of the coil 71 and the Darlington pair, so that the zener diode 22 conducts and the resistor R18 provides an emitter bias voltage for the transistor T4. The arrangement is such that as soon as the voltage at the point 100 exceeds +4 volts, the Darlington pair conducts sufficient current to cause the relay coil 71 to switch the contact 56 to a circuit breaker operating position in which the contact sets 54 are opened. Since the relay is magnetically latched, the contact 56 is held then in the circuit breaker operating position until the coil 72 is energized by manual operation of the switch 80.

The contact 56 will be held in the circuit breaker operating position once it has been switched into that position by energisation of the coil 71, even if the +15 volt supply subsequently fails.

The diode D14 protects the Darlington pair against the back e.m.f. of the coil 71 when the contact 81 is switched to the coil 72.

If a red, yellow or blue line current greater than the motor starting current suddenly appears the Darlington pair is triggered by the respective high current override coupling, which includes the capacitor C2, before the NAND gates and the comparator of the respective phase have time to act. Thus the high current override couplings ensures that the supply 50 is protected quickly when a current whose amplitude exceeds the starting amplitude at S on the curve 12 appears. The values of the components involved in the high current override couplings are such that the Darlington pair cannot be operated by the high current override couplings when the line currents are at S or below.

The reference voltage source R14, R15 and P2 is common to the comparators for all three phases, and the respective operational amplifiers have the diode D7, and diodes D8 and D9 at their outputs coupling them to the resistor R16 which is common to all three phases. The switch 80, relay 55, the Darlington pair, resistor R18 and Zener diode Z2 are common to the three phases also.

Connections to the non-inverting inputs of the yellow and blue phase operational amplifiers (not shown) are shown at Y and B respectively. Resistors R12 and R13 couple the sliding contact of the potentiometer P1 to the respective inverting inputs of the yellow and blue phase operational amplifiers. The potentiometer P1 and the resistor R6 being common to the three phases does not interfere with the proper operation of the respective comparators since the current supplied to the series combination of the resistor R6 and the potentiometer P1 consists of three negative half waves with 120° phase differences between the corresponding full waves.

A practical embodiment in accordance with FIG. 5 and intended to be used to protect a flange mounted flameproof three phase induction motor of 50 horsepower rating, nominal full load current 50 amps r.m.s. has been constructed and has the following component values:

| | | |
|---|---|---|
| R1 R2 R3 | } | 22 kilohms, 17 watts wirewound for 550 volts supply |
| R4 | | 1 kilohm, 2.5 watts wirewound |
| R5 | | 470 ohms |
| R6 | | 2.2 kilohms, 2.5 watts wirewound |
| R7 R8 | } | 30 kilohms |
| R9 to R13 | | 150 kilohms |
| R14 | | 22 kilohms |
| R15 | | 10 kilohms |
| R16 | | 3.3 kilohms |
| R17 | | 6.8 kilohms |
| R18 | | 4.7 kilohms, 0.5 watts |
| R19 | | 56 kilohms |
| R20 | | 68 kilohms |
| RB | | 180 ohms, 5 watts wirewound when motor current under full mechanical loading is 50 amps r.m.s. |
| P1 | | 470 ohms wirewound |
| P2 | | 10 kilohms wirewound |
| C1 | | 0.1 microfarads ± 20%, metallised paper film |
| C2 | | 0.01 microfarads ± 20%, metallised paper film |
| Electro-optical isolator combination D3, T2 | | CNY 33, General Electric, U.S.A. |
| NAND gates 1 to 4 | | CMOS Quad NAND gate 4011, Mullard |
| Amplifier 61 | | 741T Fairchild |

| | -continued |
|---|---|
| Transistor T1, T3 | BC 107, Mullard |
| Transistor T4 | BFY 50, Mullard |
| Diodes D4, D5, D6, D11, D12, D13, D14 | IN 4005 (600 volts, 1 amp) |
| Diodes D7, D8, D9, D15, D16, D17 | OA 202 (150 volts, 80 milliamps) Mullard |
| Zener Diodes Z1, Z2 | BZX85 2V7 (2.7 volts, 1.3 watts) |
| Relay 55 | HDS7 Hellerman Deutsch, half crystal can size, 15 volt coils |

Current transformers (each): ratio 1 to 1000: wound core of 1 inch wide, 0.011 inch thick UNISIL 41 strip, inside diameter 1.75 inches; outside diameter 2.625 inches; secondary winding 1000 turns of 26 swg enamelled copper wire.

All the resistors, except where otherwise stated, are 0.25 watt high stability carbon film.

In the practical embodiment of FIG. 5, all components for all three phases, except the electro-optical isolators and associated components at line potential, the current transformers and burden resistors, and the manually operated set and reset switch, are mounted on two printed circuit boards which are mounted within a Keyswitch P304 Plug-in Module.

The diodes D1, D2 and D3 emit in the infra red part of the spectrum, and the photo transistors of the electro-optical isolators are accordingly sensitive to infra red radiation. In a modification of FIG. 5, the three electro-optical isolators are replaced by one three phase voltage transformer and three BC 107 transistors, each having a base input circuit as shown for the transistor T1, replacing the transistor T2 or its equivalent for the yellow and blue phases.

The constants m and $\Phi_{cv}$ in the equation $$I = m(\Phi_v - \Phi_{cv})$$

for each of the three phases are set by adjustment of the sliding contact of the potentiometer P1 and adjustment of the variable resistor P2, the potentiometer P1 determining the constant m, and the resistor P2 determining the constant $\Phi_{cv}$. The summed possible values of the voltage representing $\Phi$ range from +15 volts to +30 volts as can be seen from FIG. 7. The constant level of +15 volts included in this voltage is removed by the biasing of the operational amplifiers at their non-inverting inputs. Line currents establish a range of possible voltage amplitudes across the burden resistors in accordance with the ratios of the current transformers and the impedances of the burden resistors. The setting of the sliding contact of the potentiometer P1 establishes at the common ends of the resistors R11, R12 and R13 a range of possible voltage values which are proportional to the possible line current amplitudes and are scaled so as to be representative of 1/m) in relation to the values of phase difference $\Phi$ represented by the outputs of the three groups of four NAND gates such as the gates 1 to 4 of FIG. 5. Considering the relation for line current $$I_L = n/R_B \cdot mK \, (\Phi - \Phi_c)$$

then, if, for a particular motor we measure the slope, in amperes per degree, of the characteristic SF (FIG. 4) and the required value of $\Phi_c$ in degrees, then the required value of m may be calculated from the equation:

slope of characteristic $= (n/R_B) \cdot m \, K$, convenient values of n, $R_B$ and K having been chosen. The potentiometer P1 may then be set to give the required value of 1/m. Similarly, the setting of variable resistor P2 may be calculated from the required value of $\Phi_c$.

Figure 9:
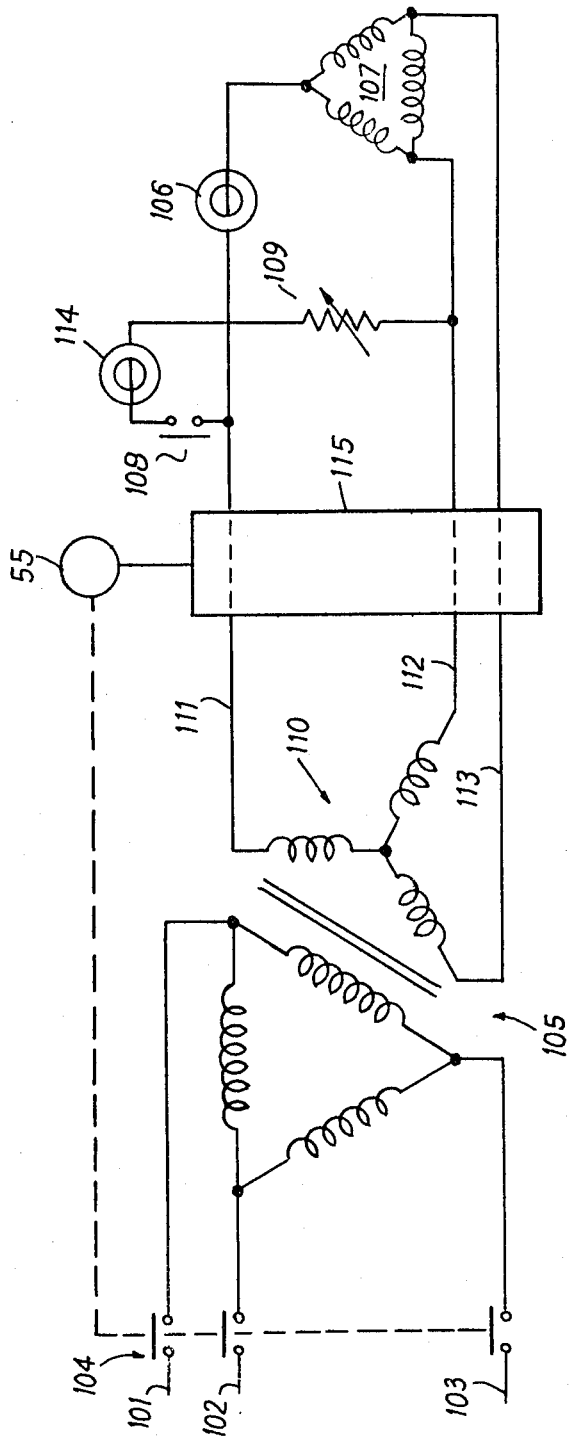
FIG. 9 is a circuit diagram of a test circuit for the embodiment of FIG. 5.

FIG. 9 shows a test circuit for testing the operation of the embodiment of FIG. 5 modified as described hereinafter with reference to FIG. 15.

The test circuit includes three phase lines 101, 102 and 103 of a three phase 3.3 kilovolt supply, three sets of contacts 104 of a master circuit breaker (not shown) in the connections of the lines 101, 102 and 103 to the primary windings of a three phase 3.3 kilovolt to 550 volt plant transformer 105, a current transformer 106 arranged to sense current flowing into the stator 107 of a 50 horse-power flange mounted flameproof induction motor (not otherwise shown) of nominal full load current amplitude 50 amps from a red phase line 111 of the 550 volt three phase supply constituted by the star connected secondary windings 110 of the transformer 105. The motor is arranged to be loaded by a Heenan-Dynamatic eddy current dynamometer (not shown). A fault of unity power factor can be simulated by closure of a make switch 108 in series with a fault resistor 109, which is variable, between the red phase line 111 and a yellow phase line 112. Unity power factor faults between the red and blue phase lines and between the yellow and blue phase lines can be simulated correspondingly by make switches and fault resistors not shown. A further current transformer 114 is arranged to sense fault current which flows into the fault resistor 109, and fault currents between the other two pairs of phase lines can be sensed in the same way.

The relay 55 of the embodiment of FIG. 5 is arranged to control the opening of the sets of contacts 104, and the remainder of the embodiment of FIG. 5 is represented in FIG. 9 by a block 115 and senses the line currents and line to line voltages of the supply lines 111, 112 and 113 between the secondary windings 110 and the fault simulated by the switch 108 and the resistor 109.

When the operation of the embodiment in response to a fault between the red and yellow phase lines 111 and 112 is to be tested, display signals representative of the condition of the relay 55 and of the fault and motor currents are obtained from the relay 55 and the current transformers 114 and 106, and the voltage at the common cathodes of the diodes D7, D8 and D9 of FIG. 5 is displayed, the display signals being provided on the screen of a cathode ray oscilloscope (not shown).

Figure 10:
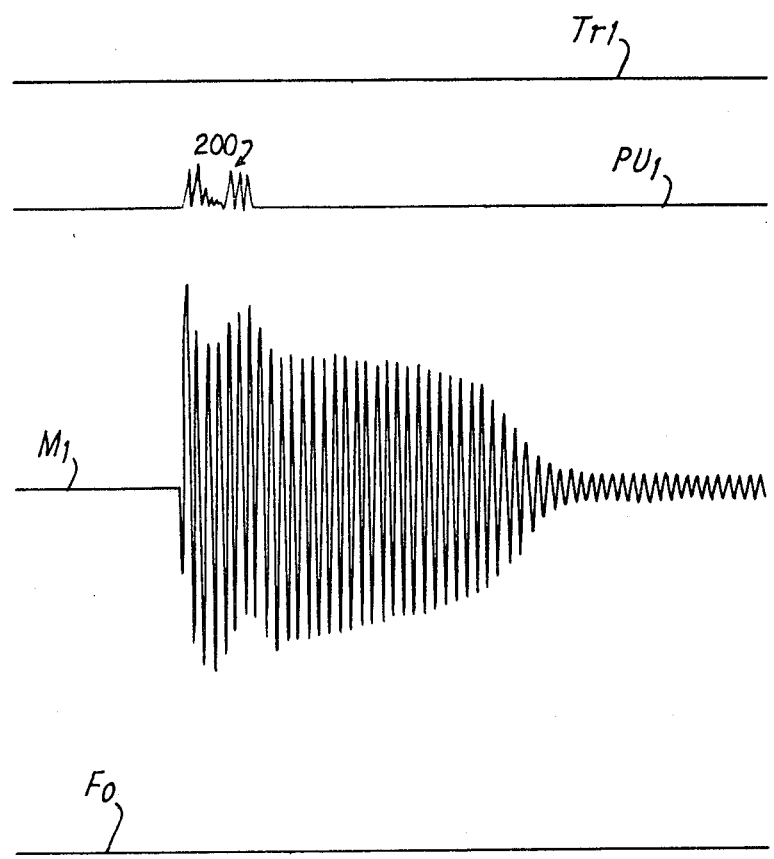
FIG. 10 is a graphical representation of signals obtained from the test circuit of FIG. 9 on direct-on-line starting of a three phase induction

FIG. 10 shows graphically the display signals obtained during normal direct on line starting of the motor in the test circuit with no loading of the motor. In FIG. 10, a horizontal line Tr 1 shows no change in the state of the relay 55. A horizontal line PU$_1$ including a short region 200 of positive going excursions shows no change of voltage level at the common cathodes of diode D7, D8 and D9. Motor current sensed by the transformer 106 is represented by a trace M$_1$ which has an initial period at zero level followed by starting current at an amplitude of substantially 430 amps which diminishes to a running current at an amplitude of substantially 35 amps. A zero fault current is represented by a horizontal line F$_0$.

In obtaining the signals of FIG. 10, the motor is started from rest. On connection of the supply to the motor, a slight transient appears at the common cathodes of the diodes, as shown by the region 200 of the line PU$_1$ of FIG. 10, but this transient is not sufficient to trip the relay 55. The transient on starting is caused by the line current to the motor being initially asymmetrical with respect to zero, and its duration is related to the point-on-wave at which the motor is energised. The voltage at the common cathodes of the diodes is unaffected by loading of the motor.

Figure 11:
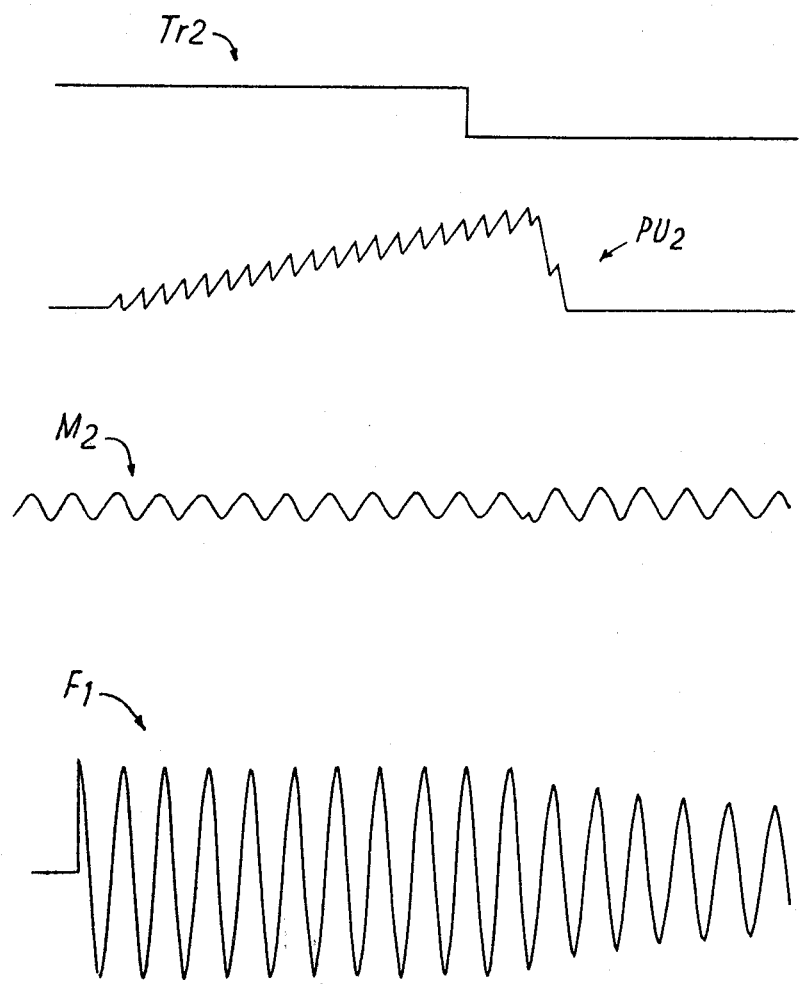
FIG. 11 is a graphical representation of signals obtained from the test circuit of FIG. 9 during the occurence of a two phase short circuit fault when the motor is running.

FIG. 11 shows the display signals obtained when the motor is running with no load and a fault current F$_1$ of 25.5 amps r.m.s is introduced by closure of the make switch 108 with a suitable setting of the variable fault resistor 109. After about half a cycle of line current from the time of onset of the fault current F$_1$ the voltage at the common cathodes of the diodes begins to rise in a series of sawtooth oscillations of substantially constant amplitude as shown at PU$_2$ in FIG. 11. 180 milliseconds from the onset of the fault current the relay 55 trips, as shown by a step in the outline Tr2 in FIG. 11. About one and half phase current cycles after the tripping of the relay 55, the circuit breaker contact sets 104 are open and the voltage at the common cathodes of the diodes returns rapidly to the normal level. For some time after disconnection of the motor from the supply by the circuit breaker contact sets 104, the motor acts as a generator powered by the momentum of its rotor. The amplitudes and frequency of the motor and fault currents gradually diminish as the rotor slows down to rest, as can be seen from the traces M$_2$ and F$_1$ in FIG. 11 representing the motor and fault currents.

The signals represented in FIG. 11 are obtained with the motor under no load and are therefore those of the worst case so far as sensitivity of the apparatus of FIG. 5 is concerned, as can be seen from FIG. 4, the point Z, corresponding to the line current and phase difference conditions prevailing when the motor has no load, being furthest from the line 13 defined by the equation $$I_L = (n/R_B) \cdot mK (\Phi - \Phi_c)$$

A fault current of 25.5 amps r.m.s. is substantially the smallest which the embodiment of FIG. 5 can respond to under these conditions, a fault current of 20.0 amps r.m.s. when the motor is not loaded failing to cause the relay 55 to trip. A measured minimum fault current for which tripping under no motor loading occurred was 25.34 amps r.m.s.

Figure 12:
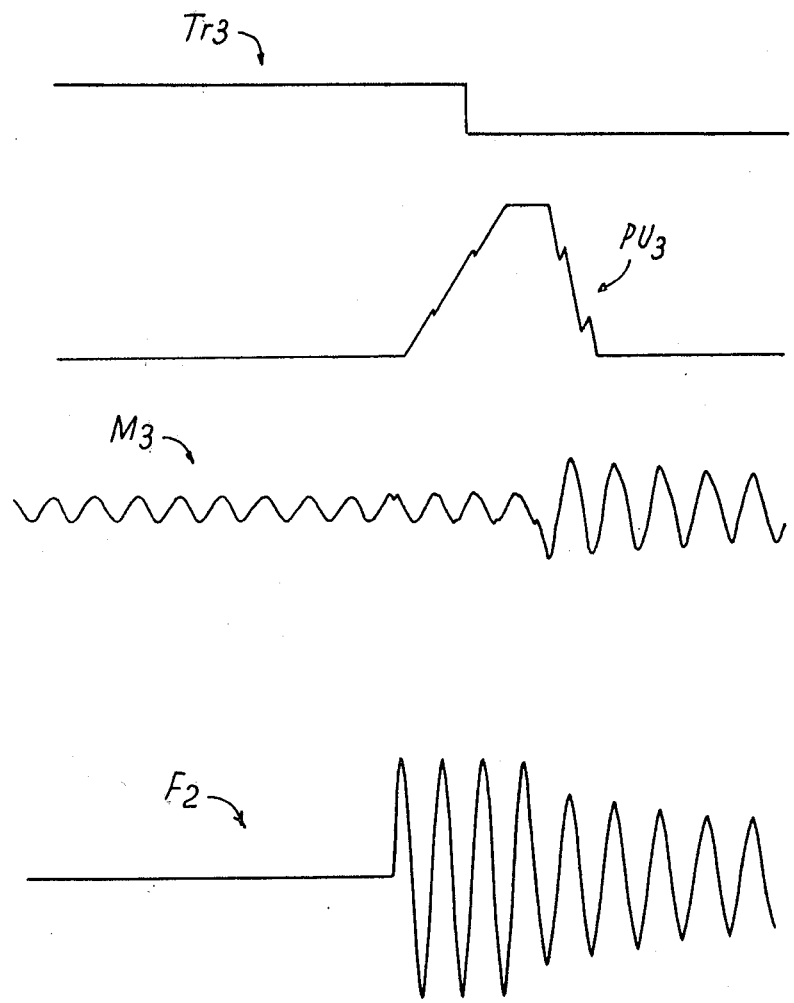
FIGS. 12 and 13 are graphical representations similar to FIG. 11.
Figure 13:
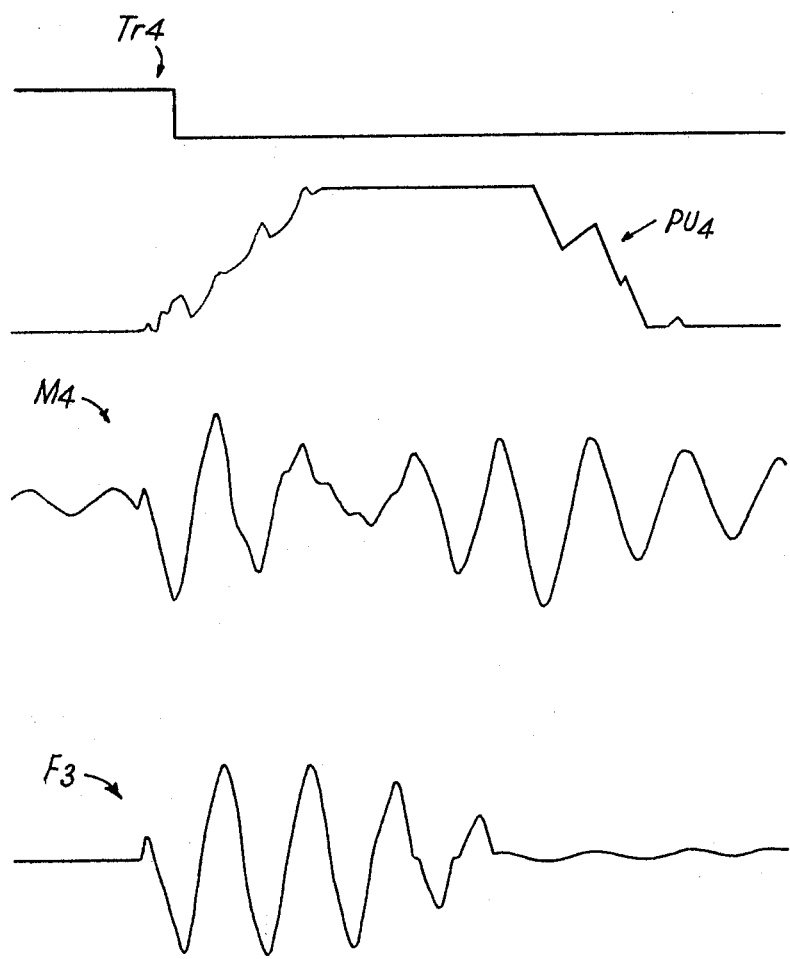

FIG. 12 shows the resultant traces, Tr 3 representing a trip signal, PU$_3$ the voltage at the common cathodes of the diodes M$_3$ the motor current, and F$_2$ the fault current, when the motor is running under no load and a fault current of 114 amps r.m.s. is introduced. The voltage represented by PU$_3$ begins to rise almost immediately the fault current is introduced. Tripping occurs 40 milliseconds after the onset of the fault current. The rise of the voltage shown by PU$_3$ is so rapid that the voltage reaches its upper level before the contact sets 104 have opened. As soon as these contact sets open, the voltage at the common cathodes of the diodes begins to return to its lower level, and the motor acts as a generator of diminishing output and frequency.

Results similar to those of FIG. 12 are obtained for fault currents of up to 3,200 amps r.m.s., if the high current override couplings of FIG. 5 are removed, the time elapsing from the start of the fault current before tripping occurs, referred to hereinafter as the tripping time, having fallen to 20 milliseconds for such a fault current. An empirical relationship between the tripping time is found to have the form $$t = A (I_f - c)^{-a}$$

where
  t is tripping time in seconds,
  $I_f$ is fault current in amps r.m.s.
  A is a positive constant of magnitude 0.098,
  c is the minimum tripping current of 25.34 amps r.m.s.,
  and a is a positive constant of magnitude 0.197.

The high current override couplings come into operation at fault current amplitudes above normal starting line current independently of phase relationships with the supply voltage. FIG. 3 shows traces Tr4, PU4, M4 and F$_3$ for the relay, the common cathodes of the diodes motor current and fault current obtained when the red phase high current override coupling becomes effective in response to a fault current of 4,200 amps r.m.s. The fastest tripping time for this current is 6 milliseconds. The fastest tripping times with the high current override coupling acting in response to fault currents of 3,200 amps r.m.s. and 1,500 amps r.m.s. are 7 and 8 milliseconds respectively. Tripping times for two phase short circuit faults are dependent to some extent on the point-on-wave at which the fault current starts.

FIG. 14 shows the results obtained from the test circuit of FIG. 9 when the motor is not connected and a fault current of 0.7 amps r.m.s. is introduced. Traces Tr5, PU5, M5 and F4 are representative of the relay display signal, the voltage at the common cathodes of the diodes the motor red line current and the fault current, the motor current obviously being zero. The tripping time is 100 milliseconds. The tripping time for a fault current of 1.4 amps r.m.s. is 68 milliseconds.

The tripping times given above all include the operating time of the relay 55, which for the particular example described, is stated by the manufacturers to be a maximum of 3 milliseconds. Shorter tripping times can be obtained by using a silicon controlled rectifier instead of the relay 55.

When the motor is fully loaded, the particular example of FIG. 5 described hereinbefore can operate in response to fault currents which are one fifth of the current drawn on one phase by the motor.

The apparatus of FIG. 5 can be modified to enable it to open the circuit breaker contact sets 54 in response to fault currents at substantially 0.5 amps r.m.s. when the motor is not connected to the supply. The purpose of the modifications is to bring the collector voltages of the phototransistors into phase with the line to line voltages instead of the line to neutral voltages, and to ensure that a square wave voltage appears across the burden resistors of the current transformers even when the line current is due solely to a low fault current of substantially 0.5 amps r.m.s. The modification of the electro-optical isolator circuitry is shown at (a) in FIG. 15. Capacitors C3, C4 and C5 are connected in series with the resistors R1, R2 and R3 respectively. For a 550 volt three phase supply:

$$R1 = R2 = R3 = 19 \text{ kilohms, 17 watts}$$

and $$C3 = C4 = C5 = 0.3 \text{ microfarads.}$$

For a 1100 volt three phase supply:

$$R1 = R2 = R3 = 38 \text{ kilohms, 34 watts}$$

and $$C3 = C4 = C5 = 0.15 \text{ microfarads.}$$

The modification of the current transformer circuitry are identical for each phase and so only the modified red phase circuitry is shown at (b) in FIG. 15. The modification consists in the connection of a diode bridge $D_B$ in series with the burden resistor $R_B$ between the ends x and y of the secondary winding of the current transformer $G_1$. The diode bridge $D_B$ consists of four diodes forming the arms of the bridge and a fifth diode forming the diagonal of the bridge between the two corners not connected directly to the resistor $R_B$ or the zero volts supply line. Consequently if any current at all flows between the ends x and y through the resistor $R_B$ and the bridge $D_B$, the voltage between x and y cannot be less than the sum of the three forward voltage drops of three of the diodes of the bridge $D_B$ in series. The five diodes of the bridge are, in this example, five IN4005 diodes. The resultant square wave voltage 300 between x and y for a phase current of substantially 0.5 amps r.m.s. is shown at (c) and has an amplitude of 1.5 volts, i.e., three times 0.5 volts, and a pulse width of 10 milliseconds corresponding to the 50 Hz supply frequency.

Since the collector voltages of the photoresistors of the electro-optical isolators are brought into phase with the line to line voltages these collector voltages lead to the respective line to neutral voltages by 30°. Consequently, the embodiment must be adapted to work in accordance with testing phase differences and line current amplitudes against the equation $$I_L = \frac{n}{R_B} mK[(\Phi + 30) - (\Phi_c + 30)]$$

The algebraic sum of the output signals of the NAND gates 3 and 4 for the modifications of FIG. 15 is proportional to $(\Phi + 30)$. Consequently it is necessary to readjust the variable resistor P2 to establish $(\Phi_c + 30)$ in the voltage supplied to the non-inverting inputs of the operational amplifiers of the comparators.

The slope constant $(n/R_B) \cdot mK$ is a characteristic of the motor M to be connected to the supply 50 which the embodiments protects and consequently there is no need to readjust the potentiometer $P_1$ when the modifications of FIG. 15 are introduced. The potentiometer $P_1$ is adjusted for the motor M and need only be readjusted if a different motor replaces the motor M.

The 15 volt supply required by the embodiment of FIG. 5 is provided for example by a rectified and smoothed alternating voltage source supplied from the supply 50, or a battery or a combination of these.

It has already been mentioned that the embodiment of FIG. 5 provides the possibility of a second quadrant of operation, the line 13' of FIG. 4 then being representative of the test equation. Operation in the left hand quadrant with the line 13' can be used for protecting supplies to capacitive loads, fault current taking the line current and phase difference point to the right of the line 13'.

The movement, when a two phase short circuit fault occurs, of the point representing line current and difference in phase between line current and line to neutral voltage towards the line current axis in FIG. 4 is due to the fault current being almost in phase with the line to line voltage, i.e. the instantaneous voltage between the two supply lines between which the fault current flows, the path of the fault current providing little reactance. In the case of a three phase symmetrical short circuit fault, the respective fault currents flowing from each supply line are almost in phase with the respective line to neutral voltages. Furthermore, most if not all three phase faults start as two phase short circuit faults in which a short circuit appears between two supply lines. The embodiment of FIG. 5 will nevertheless detect three phase symmetrical short circuit faults since the presence of such faults also reduces the difference in phase between the line current and the line to neutral voltage and causes the operating point in FIG. 5 to move to the left of the line 13 or to the right of the line 13' in FIG. 4.

We claim:

1. Apparatus for sensing short circuit faults in alternating current supply lines, the apparatus comprising:
   means for sensing line current in an alternating current supply line and producing signals representative of the amplitude and phase of line current flowing in operation;
   means for sensing a line voltage of the supply line and producing a signal representative of the phase of the said line voltage;
   difference means coupled to said line current sensing means and to said voltage sensing means to receive the signals which are representative of the phases of the said current and voltage and arranged to produce in response thereto a difference output signal having a measure which varies substantially directly with difference between the said phases;
   and means for comparing a relationship of the signal representative of current amplitude and the said signal produced by the difference means with a predetermined relationship of amplitude and phase difference and producing in reponse thereto a fault state output signal representative of whether or not the sensed current amplitude is larger than the corresponding amplitude as determined by the said predetermined relationship for the said difference between the said phases, said comparing means being coupled to said line current sensing means to receive said signal representative of current amplitude and to said difference means to receive said difference output signal.

2. Apparatus as claimed in claim 1, wherein the means for sensing line current and producing signals representative of the amplitude and phase of line current flowing in operation include a current transformer core and secondary winding so arranged that the supply line for conducting the line current to be sensed forms the primary of the current transformer thus constituted.

3. Apparatus as claimed in claim 1, wherein the means for sensing voltage includes an electro-optical isolator means.

4. Apparatus as claimed in claim 3, wherein the means for sensing voltage senses the line to neutral voltage of the supply line and the electro-optical isolator means includes an Infra Red Emitting diode connected in series with a resistor to form a series combination which in use is connected between the supply line and a neutral point.

5. Apparatus as claimed in claim 1, wherein the said signals are voltage signals and the said comparing means includes an inverter arranged to receive a signal representative of the amplitude and phase of sensed line current and to produce in response thereto an inverter output signal representative of the amplitude of the sensed line current and of opposite polarity to the said signal proportional to difference, a scaler connected to the inverter to receive the inverter output signal and to divide the magnitude of the inverter output signal by a predetermined factor, and a comparator connected to the scaler and to receive the said signal produced by the difference means and to a source of reference voltage of a predetermined magnitude and polarity in accordance with the said predetermined relationship.

6. Apparatus as claimed in claim 1, wherein the means for sensing line current and producing signals and the means for sensing voltage and producing a signal produce respectively a first square wave in phase with the sensed line current and sensed square wave in phase with the second line to line or line to neutral voltage.

7. Apparatus as claimed in claim 6, wherein the said difference means includes logic gating means connected to receive the said square waves and in response thereto producing logic signals which in combination are representative of the difference in phase between the sensed current and voltage.

8. Apparatus as claimed in claim 7, wherein said logic signals are voltage signals of which the average algebraic sum over one cycle varies directly with the said difference in phase.

9. Apparatus as claimed in claim 8, wherein the difference means includes a plurality of summing resistors connected at a common junction thereof to one input of an operational amplifier included in the comparing means whereby the signal produced by the difference means is a current signal the average magnitude of which over one cycle varies substantially directly with the said difference in phase.

10. Apparatus as claimed in claim 9, wherein the operational amplifier is a differential amplifier and the said one input thereof is an inverting input, and a source of reference voltage is connected to a non-inverting input of the said amplifier so as to supply thereto a reference signal in accordance with the said predetermined relationship.

11. Apparatus as claimed in claim 7, wherein the logic gating means comprises four two input NAND gates so arranged that two of the four gates act as logic inverters connected to respective ones of the inputs of the other two gates.

12. Apparatus as claimed in claim 10, wherein the said predetermined relationship is of the form $$I_L = \frac{n}{R_B} \cdot mK (\Phi - \Phi_c)$$

where
- $I_L$ is line current amplitude in amperes,
- n is a current transformer ratio,
- $R_B$ is burden resistance in ohms,
- m is a dimensionless constant,
- K is a further constant in volts per degree,
- $\Phi$ is the phase difference between the phase, voltage and the line current in degrees, and
- $\Phi_c$ is a phase constant in degrees.

13. Apparatus as claimed in claim 1, further including means for interrupting at least the said supply line in response to the said fault state output signal being representative of the sensed current amplitude being larger than the said corresponding amplitude, the interrupting means being coupled to the comparing means to receive the said fault state output signal.

14. Apparatus for interrupting three phase supply lines having short circuit faults, the apparatus comprising:

means for sensing each line current and producing signals representative of the sensed amplitudes and phases of the line currents flowing in operation;

means for sensing the line to line or line to neutral voltages of the supply lines and producing signals representative of the phases of line voltages;

difference means coupled to said line current sensing means and to said voltage sensing means to receive the signals which are representative of the said phases and arranged to produce in response thereto three difference output signals each of which has a measure which varies substantially directly with difference in phase between the respective line current and line voltage of a respective one of the three phase lines;

means for comparing for each phase line a relationship of the respective one of the signals representative of sensed current amplitude and the respective one of the signals produced by the difference means with a predetermined relationship of amplitude and phase difference and producing in response thereto a fault state output signal representative of whether or not any one or more of the sensed current amplitudes is larger than the corresponding amplitude as determined by the respective predetermined relationship for the respective one of the said differences in phase between the respective line current and line voltage, said comprising means being coupled to said line current sensing means to receive said signal representative of current amplitude and to said difference means to receive said difference output signals;

and means for interrupting the three supply lines in response to the said fault state output signal being representative of any one or more of the sensed current amplitudes being larger than the said corresponding amplitude, the interrupting means being coupled to the comparing means to receive the said fault state output signal.

15. Apparatus as claimed in claim 14, wherein override means are provided so coupling the means for sensing each line current to the means for interrupting each phase line that if one or more of the sensed current amplitudes exceeds a predetermined value, the override means actuates the interrupting means before the said fault state output signal is representative of the one or more of the sensed current amplitudes being larger than the said corresponding amplitude or amplitudes.

16. Apparatus as claimed in claim 14, wherein the means for sensing each line current and producing signals representative of the sensed current amplitude and phases includes three current transformer cores with respective secondary windings, each of the cores being, in use, so arranged with a respective one of three phase lines that the phase line and the secondary winding constitute a current transformer, there being connected across the secondary winding of each of the said cores a respective series combination of a resistor and a diode bridge such that for the smallest current able to flow in the secondary winding a square wave voltage is provided across the respective series combination by the forward voltage drops of a plurality of the said diodes and the means for sensing voltages and producing signals representative of the phases of the voltages includes three electro-optical isolators each of which includes an Infra Red Emitting diode which is connected in series with a capacitor and a resistor and has one electrode connected to a neutral point, the impedance of the three series combinations formed by the Infra Red Diodes and the respective capacitors and resistors being such that in use with the said three series combinations star connected to three phase lines the Infra Red Emitting diodes emit radiation during half cycles of the like polarity of respective line to line voltages.

* * * * *

UNITED STATES PATENT OFFICE
CERTIFICATE OF CORRECTION

Patent No. 4,251,846    Dated February 17, 1981

Inventor(s)  Frank K. Pearson and Harold Lord

It is certified that error appears in the above-identified patent and that said Letters Patent are hereby corrected as shown below:

Column 19, line 30; change "sensed" to ---second---.
Column 19, line 31; change "second" to ---sensed---.
Column 20, lines 48-49; change "comprising" to
           ---comparing---.

Signed and Sealed this

Ninth Day of June 1981

[SEAL]

Attest:

RENE D. TEGTMEYER

*Attesting Officer*    *Acting Commissioner of Patents and Trademarks*